United States Patent [19]

Agahi-Kesheh

[11] Patent Number: 5,130,682
[45] Date of Patent: Jul. 14, 1992

[54] DIELECTRIC FILTER AND MOUNTING BRACKET ASSEMBLY

[75] Inventor: Darioush Agahi-Kesheh, Buffalo Grove, Ill.

[73] Assignee: Motorola, Inc., Schaumburg, Ill.

[21] Appl. No.: 685,116

[22] Filed: Apr. 15, 1991

[51] Int. Cl.$^5$ .......................................... H01P 1/202
[52] U.S. Cl. ..................................... 333/202; 333/206
[58] Field of Search ............... 333/202, 206, 207, 222, 333/247; 455/78, 83

[56] References Cited

U.S. PATENT DOCUMENTS

| | | | |
|---|---|---|---|
| 4,692,726 | 9/1987 | Green et al. | 333/202 X |
| 4,742,562 | 5/1988 | Kommrusch | 333/202 X |
| 4,795,991 | 1/1989 | Saito et al. | 333/181 |
| 5,023,580 | 6/1991 | Kim et al. | 333/202 X |

FOREIGN PATENT DOCUMENTS 0305201 12/1990 Japan ..................... 333/206

Primary Examiner—Eugene R. LaRoche
Assistant Examiner—Seung Ham
Attorney, Agent, or Firm—Robert H. Kelly

[57] ABSTRACT

A dielectric filter assembly and mounting therefor. The mounting bracket forms a support surface and includes integrally formed strip members for interconnecting electrodes formed upon a face surface of the dielectric filter and a circuit disposed upon an electrical circuit board. Once interconnected, reflow solder connections are formed between the strip members and the electrodes and the strip members and the circuit disposed upon the circuit board. The strip member is then severed from the mounting bracket to electrically isolate the electrode disposed upon the face surface of the dielectric filter, while maintaining the electrical connection between the electrodes formed upon the dielectric filter and the circuit disposed upon the circuit board.

33 Claims, 3 Drawing Sheets

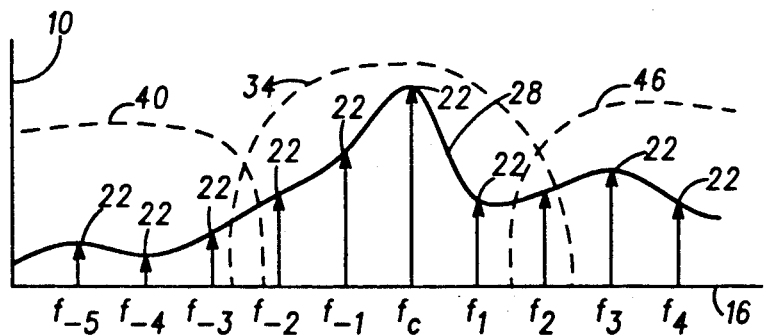
FIG. 1
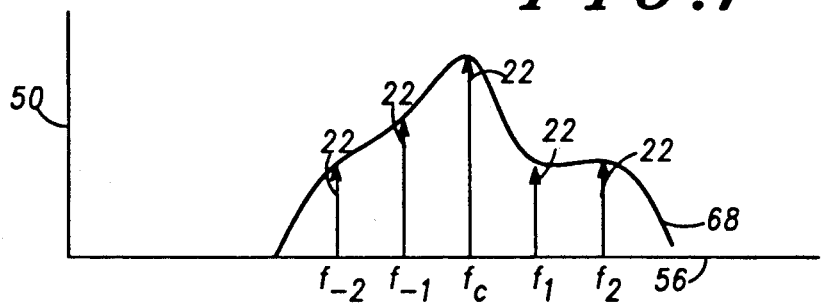
FIG. 2
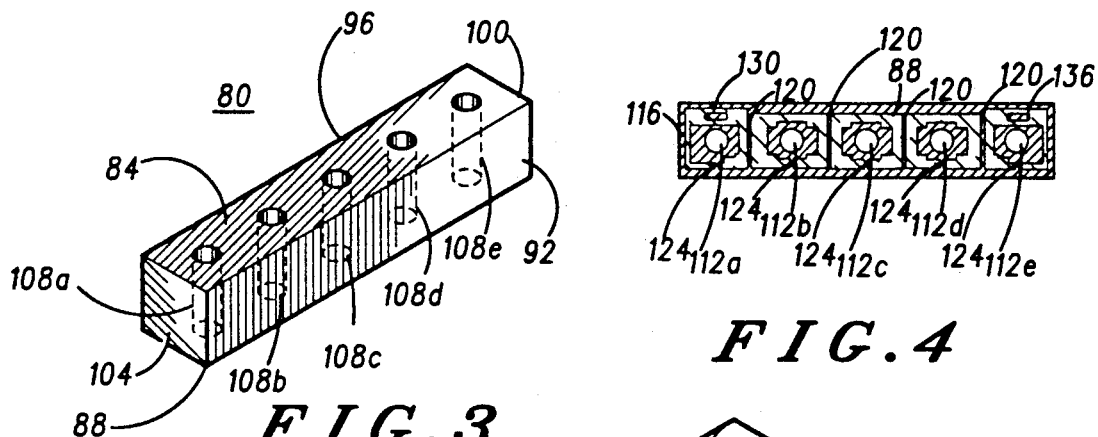
FIG. 3
FIG. 4
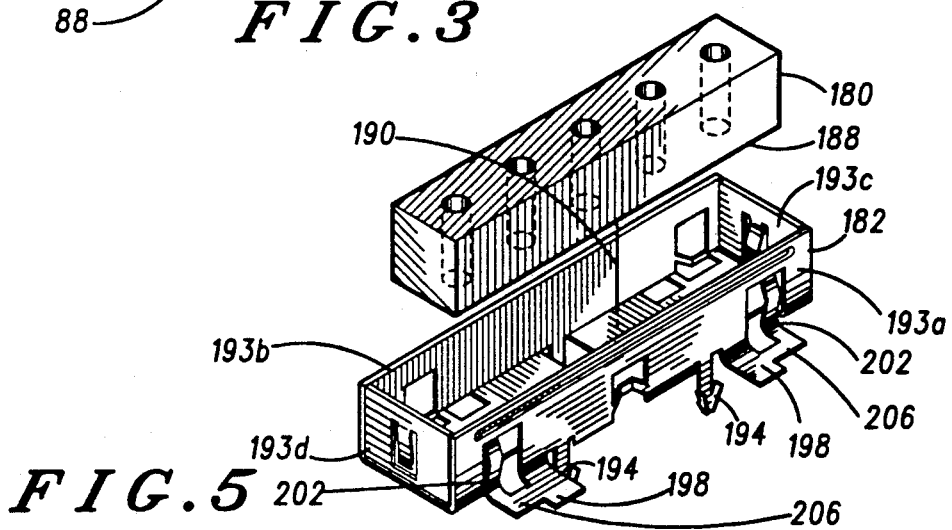
FIG. 5

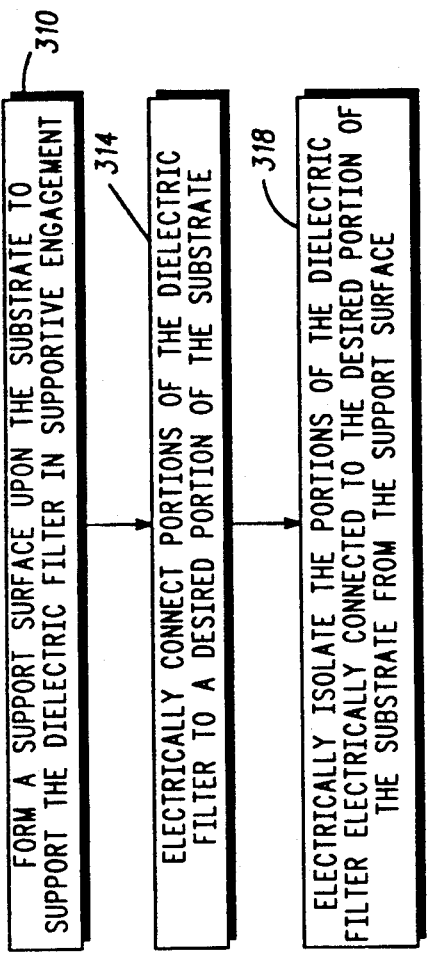
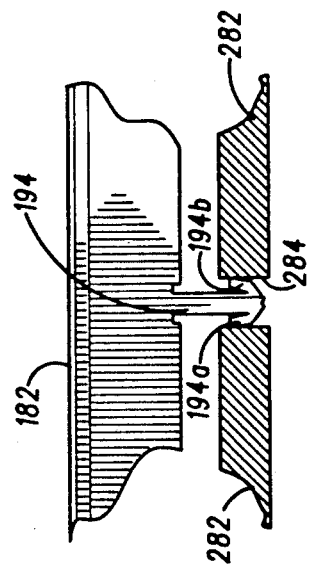
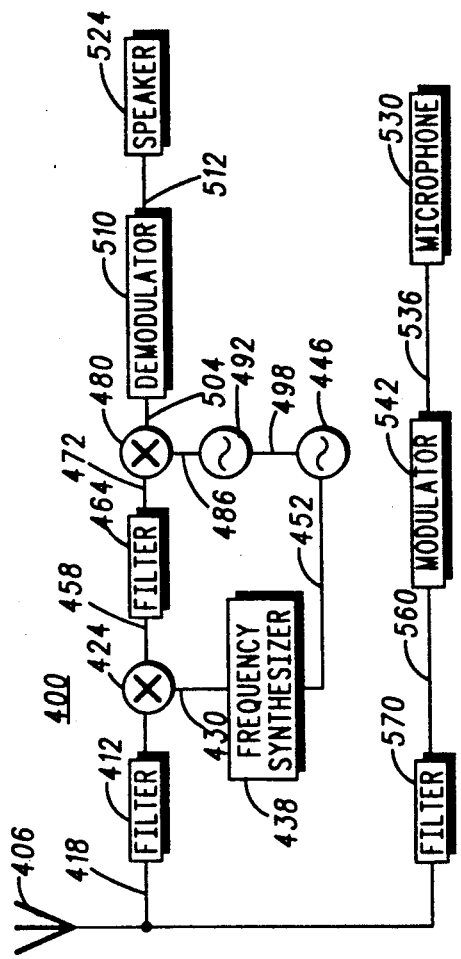
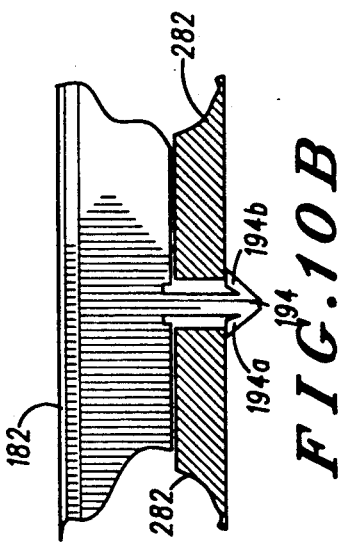

DIELECTRIC FILTER AND MOUNTING BRACKET ASSEMBLY

BACKGROUND OF THE INVENTION

The present invention relates generally to dielectric filters, and, more particularly, to a dielectric filter assembly having a mounting bracket which mounts upon a substrate to electrically connect the dielectric filter to a circuit disposed upon the substrate.

Filter circuitry which filters an input signal applied thereto of undesired frequency components is well known. For instance, designs of filter circuitry to form band pass, band reject, low pass and high pass filters are all well known. Such filter circuitry permits passage of, or rejection of, certain frequency component portions of a signal applied to the filter circuitry. A large variety of electrical circuit constructions include, as portions thereof, filter circuits formed of such filter circuits.

Filter circuitry is typically classified to be of either of two types of construction: active or passive. Active filter circuits are advantageously disposed upon integrated circuits and, hence, are of minimal sizes. However, active filter circuits are generally linear over only a limited dynamic range. Such active filter circuits also generally exhibit desired filter characteristics over only the limited dynamic range in which the active filter circuit is linear.

passive filter circuits, conversely, exhibit proper filter characteristics over a greater dynamic range. Passive filter circuits are comprised of passive filter components, namely, combinations of resistors, capacitors, and inductors. The resistive, capacitive, and inductive component values of such filter components, and their respective electrical connections therebetween, define a resonant frequency. By appropriate connection of the passive filter components, any of the above-listed filter circuits may be formed.

A passive filter circuit positioned in a series connection, for instance, with an electrical circuit forms a band pass filter which passes signal portions of a signal applied thereto which are within a range of frequencies defined by the resonant frequency of the filter circuit. The resonant frequency of the passive filter circuit is defined by the component values of the passive filter components. Appropriate selection of the values of the passive filter components causes the passive filter circuit to for a pass band of a desired bandwidth and a desired center frequency. Combinations of such series-connected, passive filter circuits may be formed to pass signal portions of any selected range of frequencies.

A passive filter circuit positioned in a shunt connection with an electrical circuit forms a band reject filter wherein signal portions of a signal applied thereto which are within a range of frequencies defined by the resonant frequency of a filter circuit are shunted, and are not passed by the filter circuit. The resonant frequency of the passive filter circuit is, again, defined by the component values of the passive filter components. Appropriate selection of the values of the passive filter components causes the passive filter circuits to form a reject band of a desired bandwidth and a desired center frequency.

Combinations of both the passive filter circuits connected in the series connection, and the passive filter circuits connected in the shunt connection may, of course, be formed to perform circuit functions as desired.

As mentioned hereinabove, a large variety of electrical circuits comprise passive filter circuits forming portions thereof. One such electrical circuit is a radio-frequency receiver circuit. Passive filter circuitry is utilized, for example, to tune the receiver, and to filter intermodulation spurs generated during down conversion and demodulation of a signal received by the receiver circuit. Additionally, passive filter circuitry is utilized to form portions of a receiver circuit to prevent passage of other spurious signals generated during down conversion of a signal received by a receiver circuit. Filter circuitry is additionally, of course, utilized to form portions of a receiver circuit to perform other filter functions.

Ceramic and other dielectric materials are often utilized to form a passive filter circuit. Passive filter circuits constructed of such materials are commonly referred to as "ceramic block filters" because of the geometric configuration of such filters. conventionally, a ceramic block filter is formed in the shape of a block, and one or more holes are drilled or otherwise formed to extend through the block. Such holes form resonating cavities which resonate at frequencies determined by the length of the cavity. Portions of the sidewalls defining the cavity are typically coated with an electrically-conductive material, such as a silver-containing compound. Portions of surfaces, or entire surfaces, of the ceramic block are also typically covered with the electrically-conductive material.

The resonating frequency of the resonating cavity formed of such holes is additionally dependant upon the surface area of the sidewalls defining such cavities.

Ceramic block filters and/or apparatus for connecting such filters to an electrical circuit are disclosed in U.S. Pat. Nos. 4,431,977; 4,673,902; 4,703,921; 4,716,391; and 4,742,562.

Transceivers, such as portable, cellular phones, oftentimes utilize such ceramic block filters. Electrical circuits of such portable transceivers include both receiver portions and transmitter portions, each of which includes one or more ceramic block filters to form filter circuits. Such ceramic block filters, for example, filter signal portions of signals received by the receiver circuitry, and filter signal portions of signals generated by the transmitter circuitry. A ceramic block filter may, for instance, form an interstage filter positioned between stages of the transmitter and/or receiver circuit of the portable transceiver, or form a duplex filter positioned between the receiver circuitry and an antenna, and between the antenna and the transmitter circuitry of the transceiver.

Typically, a ceramic block filter is mounted upon a circuit board, such as a printed circuit board, and is suitably connected to an electrical circuit disposed or mounted, thereupon. Conventionally, circuit elements such as a ceramic block filter are positioned at desired locations upon a printed circuit board. The printed circuit board, containing the desired circuit elements is then placed in a bath of molten solder. Portions of the printed circuit board are coated thereby with the solder material to affix in position the circuit elements thereupon. Such a method is referred to as a waveline solder process.

When utilizing such a solder technique, a monolithic element, such as the ceramic block filter, is susceptible to movement, i.e., the filter may "float" as the solder material liquefies during the solder operation. Therefore, conventionally, the ceramic block filter is first disposed upon, or placed within, a mounting bracket, and the mounting bracket is mounted upon the circuit board to be affixed thereto by the reflow solder operation.

U.S. Pat. No. 4,716,391, mentioned briefly hereinabove, discloses one such ceramic filter and mounting bracket therefor. Glass feed-thru pins electrically connect input and output electrodes formed upon a face surface of the ceramic block filter. The feed-thru pins are inserted into openings formed in the mounting bracket to abut against the ceramic block filter. Once positioned, the feed-thru pins are soldered to the electrode of the ceramic block filter and to the printed circuit board by the waveline solder process.

When using such a filter and bracket combination, care must be exercised to ensure that the pins do not become loose and fall out of the openings defined by the resonating cavities prior to soldering thereto. Also, care must be exercised to ensure that excessive amounts of solder are not applied to the pins as short circuiting of the ceramic block filter could result.

Most significantly, however, a waveline solder process leaves a residue of solder flux on the circuit board which must be removed from the circuit board. Most easily, the solder flux may be removed by application of a FREON (TM)-based solvent to the printed circuit board. However, because of environmental concerns regarding the use of FREON-based compounds, application of such a solvent to remove solder flux from a circuit board is to be discontinued.

Methods and apparatus for electrically-connecting ceramic block filters to a printed circuit board have been developed which utilize reflow solder techniques. A reflow solder technique is one in which small amounts of solder material are placed upon surface areas of the printed circuit board and circuit elements which are to be soldered theretogether. The circuit board is then elevated in temperature (such as placement thereof in an oven) to liquefy the solder material to solder thereby the circuit elements to the circuit board.

What is needed, therefore, is a dielectric block filter assembly having a mounting block which is permitting of electrical connection to a printed circuit board to be affixed in position thereat by use of a reflow solder technique.

SUMMARY OF THE INVENTION

The present invention, therefore, advantageously provides a mounting bracket for mounting a dielectric filter construction upon a substrate, such as a printed circuit board.

The present further advantageously provides a dielectric filter assembly which may be electrically connected to an electrical circuit disposed upon a circuit board.

The present invention still further advantageously provides a mounting bracket having means formed integral therewith for electrically connecting a dielectric filter to an electrical circuit disposed upon a substrate.

The present invention yet further provides a method for mounting a dielectric filter upon a substrate.

The present invention provides further advantages and features, the details of which will become more apparent by reading the detailed description of the preferred embodiments hereinbelow.

In accordance with the present invention, therefore, a mounting bracket for mounting a dielectric filter construction upon a substrate is disclosed. The mounting bracket comprises a support surface for supporting the dielectric filter construction in supportive engagement thereat. Structure formed integral with the support surface electrically connects portions of the dielectric filter construction to the substrate when the dielectric filter construction is supportively engaged at the support surface. Such structure is severable from the support surface once the dielectric filter construction is supportively engaged thereat to isolate electrically the structure which electrically connects the support surface and the dielectric filter while maintaining the electrical connection between the portions of the dielectric filter construction and the substrate.

BRIEF DESCRIPTION OF THE DRAWINGS

The present invention will be better understood when read in light of the accompanying drawings in which:

FIG. 1 is a graphical representation of a broadband signal plotted as a function of frequency which may be filtered by the dielectric filter assembly of the present invention:

FIG. 2 is a graphical representation, similar to the graphical representation of FIG. 1, but illustrating a filtered signal formed by a dielectric filter assembly constructed according to the teachings of the present invention responsive to the application of the signal of FIG. 1 thereto;

FIG. 3 is an orthogonal view of a dielectric filter forming a portion of the dielectric filter assembly of the present invention;

FIG. 4 is a view of a bottom surface of the dielectric filter of FIG. 3 illustrating the input and output electrodes formed on such bottom surface thereof;

FIG. 5 is an exploded view of the dielectric filter and the mounting bracket which together form the dielectric filter assembly of a preferred embodiment of the present invention;

FIGS. 10a and 10b are enlarged views of a portion of a printed circuit board illustrating the connection between the hooked projections of the mounting bracket of FIGS. 5–9 which affix the mounting bracket to a substrate, such as a circuit board, wherein FIG. 10a illustrates the hooked projection as the hooked projection is inserted through an aperture formed to extend through the circuit board, and FIG. 10b illustrates the connection between the hooked projection and the circuit board when the mounting bracket is affixed to the circuit board;

FIG. 11 is a flow diagram listing the method steps of the method of the present invention; and FIG. 12 is a block diagram of a radiotelephone of which the dielectric filter assembly of the preceding Figures may advantageously form a portion.

DESCRIPTION OF THE PREFERRED EMBODIMENTS

Figure 6:
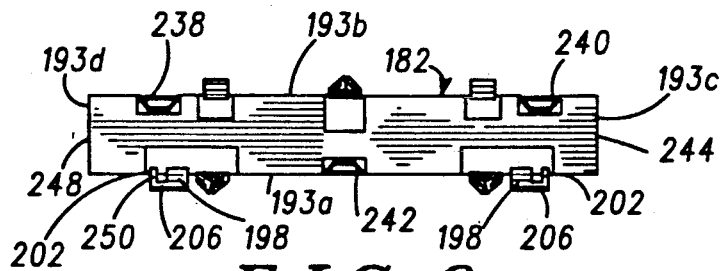
FIG. 6 is an overhead view of the mounting bracket of the dielectric filter construction of FIG. 5.

Turning first to FIG. 1, a signal, such as a voice signal or a modulated voice signal, is plotted as a function of frequency upon an axis system defined by ordinate axis 10 and abscissa axis 16. The power of the signal, scaled in terms of magnitude, e.g., watts, milliwatts, or dB, on ordinate axis 10, is plotted as a function of frequency, scaled in terms of hertz on abscissa axis 16. As illustrated, a typical signal is actually comprised of a plurality of component portions, each of a particular frequency. A summation of the plurality of the signal component portions forms a resultant signal. The plurality of signal component portions is represented in the graphical representation of FIG. 1 by a plurality of vertically-extending arrows 22 (i.e. spikes), each characterized by a particular cyclic frequency. When the plurality of signal component portions are summed theretogether, the resultant signal is formed, which may be represented by an envelope represented by envelope 28.

The signal represented in the graphical representation of FIG. 1 is referred to as a "broadband" signal as the resultant signal, represented by envelope 28, is comprised of signal component portions over a broad range of frequencies. It is noted that, although the signal of FIG. 1 is represented by a plurality of vertically-extending arrows 18, an actual signal is comprised of a sum of signals having frequencies centered at the frequencies of the vertically-extending arrows 22.

A filter is operative to pass certain component portions (i.e., frequency or spectral component portions) of a signal, and reject other component portions, of the signal. Envelope 34, shown in hatch, of FIG. 1 represents a passband of a bandpass filter which passes the component portions of the broadband signals applied to the filter within the pass band of the filter. Other component portions of the broadband signal are rejected, and are not passed by the filter. Envelope 40, shown in hatch of FIG. 1 is representative of a lowpass filter. Component portions of a broadband signal applied to a lowpass filter within the passband of the filter are passed by the lowpass filter. Other component portions of the broadband signal are rejected and are not passed. Similarly, envelope 46, shown in hatch, represents the passband of a highpass filter. Component portions of the broadband signal applied to a highpass filter within the passband of the highpass filter are passed by the highpass filter. Other component portions of the broadband signal are rejected, and are not passed by the highpass filter. Combinations of highpass, lowpass, and bandpass filters can together form other types of filter circuits, such as, for example, a band reject filter.

FIG. 2 is a graphical representation, similar to that of FIG. 1, wherein the power of a signal, again scaled in terms of magnitude, e.g., watts, milliwatts, or dB, is plotted upon ordinate axis 50 as a function of frequency, scaled in terms of hertz on abscissa axis 56. The signal plotted in FIG. 2 is that of a filtered signal, i.e., a band-limited signal, which is formed by a bandpass filter having a passband represented by envelope 34 of FIG. 1. Component portions of a broadband signal applied to the bandpass filter within the passband of the filter are passed by the filter and form the filtered signal thereby.

The filtered signal is comprised of component portions of the broadband signal (represented by envelope 28 of FIG. 1) within the passband of the bandpass filter. Component portions of the signal applied to the filter beyond the passband of the filter are not passed by the filter, and are rejected by the filter. Again, and as illustrated, the filtered signal, i.e., the band-limited signal, is actually comprised of a plurality of component potions, represented in the figure by arrows (i.e., spikes), and the summation of the component portions of the filtered signal may be represented by envelope 68. It is noted that the bandwidth of the filtered signal, represented by envelope 68, is no greater than the passband of the bandpass filter, represented by envelope 34 of FIG. 1. Other filters having other passbands, bandwidths and other filter characteristics form filtered signals responsive to the characteristics of the specific filter circuit to which a broadband signal is applied.

Turning now to the orthogonal view of FIG. 3, a dielectric filter forming a portion of the dielectric filter assembly of a preferred embodiment of the present invention, and referred to generally by reference numeral 80, is illustrated. In the preferred embodiment, dielectric filter 80 is formed in a rectangular, block-like configuration, similar to the ceramic block filters as above-described. Filter 80 defines top surface 84, bottom surface 88, front surface 92, rear surface 96, and end surfaces 100 and 104. A plurality of resonating cavities, here five resonating cavities 108a-108e are formed to extend between top surface 84 and bottom surface 88. Resonating cavities 108a-e define openings upon the top and bottom surfaces 84 and 88 of the filter 80 thereby.

dielectric filters comprised of other geometric configurations and other numbers of resonating cavities are, of course, possible. surfaces 84, 92, 96, 100, and 104 as well as surface areas which define resonating cavities 108a-e are substantially covered with an electrically-conductive material, such as a silver containing material. Portions of bottom surface 88 of filter 80 are additionally coated with such electrically-conductive material.

FIG. 4 is a view, in elevation, of bottom surface 88 of dielectric filter 80 of FIG. 3. Portions of bottom surface 88, as noted above, are coated with the electrically-conductive material. Such coated portions are indicated in the figure by the hatched-markings. Formed upon bottom surface 88 are openings 112a, 112b, 112c, 112d, and 112e defined by resonating cavities 108a-e, respectively. As illustrated, portions immediately surrounding openings 112a-112b of bottom surface 88 are coated with the electrically-conductive material.

A peripheral portion 116 extending about the perimeter of bottom surface 88 is additionally coated with the electrically-conductive material. Bars 120 of electrically-conductive material span opposing sides of peripheral portion 116, and bars 124 of the electrically-conductive material connect the peripheral portion 116 to portions immediately surrounding openings 112b-112d.

Additionally formed upon bottom surface 88 are electrodes 130 and 136, also formed of the electrically conductive material. Electrodes 130 and 136 are not electrically coupled to the coatings of electrically-conductive material which coat other portions of filter 80, but, rather, are capacitively coupled thereto. Electrodes 130 and 136 form input and output electrodes, respectively, which permit connection of filter 80 to an electrical circuit.

Turning now to the exploded view of FIG. 5, dielectric filter 180, which is similar in construction to dielectric filter 80 of FIGS. 3-4 is disposed above mounting bracket 182. Filter 180 is of dimensions permitting insertion of the filter into mounting bracket 182 such that bottom surface 188 of filter 180 abuts against a support surface formed within mounting bracket 182 when filter 180 is translated in the direction indicated by arrow 190. Mounting bracket 182 includes sidewalls 193a, 193b, 193c,m and 193d.

FIG. 5 further illustrates hooked projections 194 protruding beneath a bottom surface of the body of mounting bracket 182, foot members 198 extending horizontally beyond a side surface of the body of mounting bracket 182, and strip members 202 formed integral with a foot member 198 and connected thereto by isthmal portions 206.

FIG. 6 is an overhead view of mounting bracket 182 shown in the exploded view of FIG. 5. In the preferred embodiment, the support surface of mounting bracket 182 upon which dielectric filter 180 rests in supportive engagement thereagainst is comprised of tabular indentations, here indentations 238, 240, and 242 formed of portions of the sidewalls of mounting bracket 182.

In the preferred embodiment, the support surface is comprised of at least three tabular indentations as three tabular indentations define a planar surface to support the dielectric filter 180 in supportive engagement thereagainst. Other numbers and other configurations of the tabular indentations are, of course, possible. In the preferred embodiment of FIG. 6, tabular indentations 238-242, as illustrated in which tabular indentations 238 and 240 are disposed upon sidewall 193b at opposite ends of sidewalls 193b, and tabular indentation 242 is disposed upon sidewall 193a at a location intermediate between the positioning of tabular indentations 238 and 240 to provide thereby a stable support surface permitting supportive engagement of a bottom surface of dielectric filter 180 thereagainst.

The overhead view of FIG. 6 further illustrates spring members 244 and 248 forming leaf springs formed of portions of sidewalls 193d and 193c respectively. Spring members 244 and 248 exert a spring force for exertion against side surfaces of dielectric filter 180 when inserted within mounting bracket to be supported against the support surface formed thereof.

The overhead view of FIG. 6 additionally illustrates foot members 198 protruding beyond sidewall 193a and two strip members 202 integrally formed with the foot members 198 and connected thereto by isthmal portion 206. It is noted that strip portions 202 include end portions 250 which, as will be noted more fully hereinbelow, are of heightwise positions corresponding to the heightwise position of the support surface defined by tabular indentations 238-242.

Figure 7:
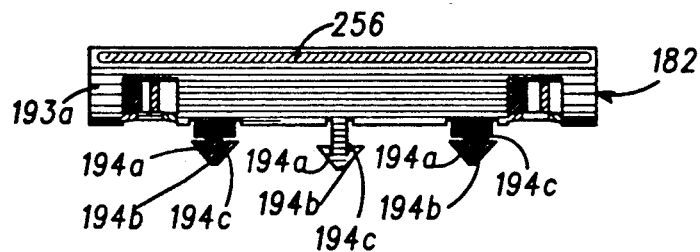
FIG. 7 is a side view, in elevation, of the mounting bracket of FIGS. 5–6.

FIG. 7 is a side, elevational view of mounting bracket 182 of FIGS. 5-6. The elevation view of FIG. 7 better illustrates the positioning of hooked projections 194 which protrude beneath a bottom surface of the body of mounting bracket 182. In the preferred embodiment, one hooked projection 194 is formed integral with, and extends beneath sidewall 193a. Two hooked projections 194 are formed integral width opposing sidewall 193b and protrude beneath the sidewall 193b. Hooked projection 194 formed integral with sidewall 193a is positioned intermediate between the spaced-apart hooked projections 194 formed integral with sidewall 193b. Ends of hooked projections 194 are bent to form back-angled portions 194a and 194b.

Back-angled portions 194a and 194b are capable of elastic deformation responsive to application of compressive forces thereagainst. When compressive forces are no longer exerted thereagainst, back-angled portions 194a and 194b of hooked projections 194 are capable of re-expansion to return to their respective positions as illustrated in the side view of FIG. 7. FIG. 7 further illustrates ridge member 256 extending laterally along substantially the entire length of sidewall 193a. A similar ridge member is similarly preferably formed to extend laterally along substantially the entire length of sidewall of 193b. Ridge members 256 form solder surfaces for forming positive solder connections with the dielectric filter 180, as will be described more fully hereinbelow.

Figure 8:
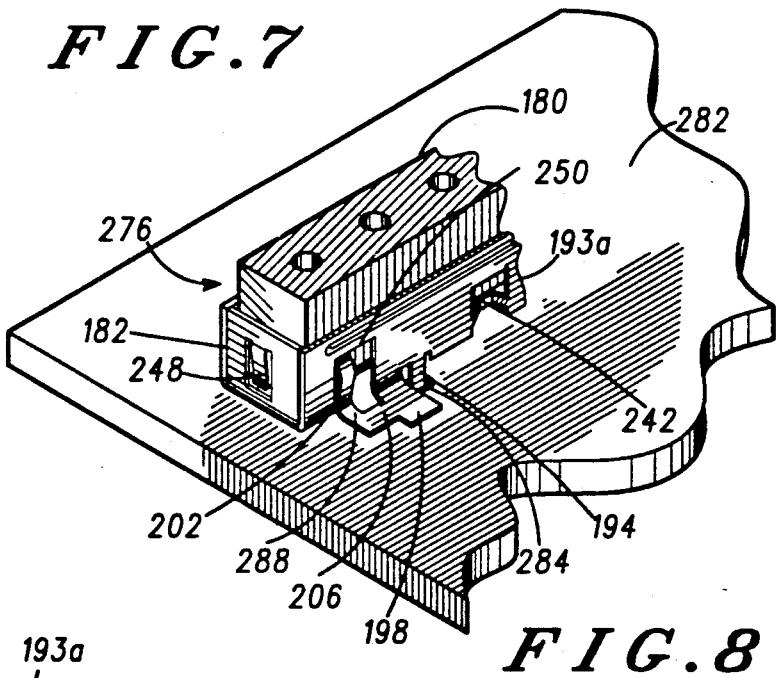
FIG. 8 is a cut-away view of the dielectric filter and mounting bracket of the dielectric filter assembly of the present invention mounted in position upon a circuit board.

FIG. 8 is a cutaway view of dielectric filter 180 positioned at the support surface formed of mounting bracket 182. Dielectric filter 180 and mounting bracket 182 together form the dielectric filter assembly of the present invention, and referred to generally by reference numeral 276. As illustrated, the bottom surface of dielectric filter abuts against the support surface formed of mounting bracket 182, in the cutaway view of FIG. 8, the bottom surface of dielectric filter 180 is seated against tabular indentation 242. Mounting bracket 182 is affixed in position upon a substrate, here printed circuit board 282. A bottom surface of foot member 198 extending horizontally beyond sidewall 193a of mounting bracket 182 abuts against a top surface of circuits board 282 to rest thereagainst. Hooked projection 194 formed integral with sidewall 193a and extending therebeneath is inserted to extend through an aperture 284 formed to extend through the circuit board 282.

Strip member 202 formed integral with foot member 198 and connected thereto by isthmal portion 206 includes end portion 250 which abuts against electrode 230, shown in hatch, which is formed upon a bottom surface of dielectric filter 180. Electrode 230 corresponds to electrode 130 of dielectric filter 80 shown in the bottom view of FIG. 4. A second end portion, indicated by reference number 288 of strip member 202 is formed to be in the same planar configuration as that of foot member 198 and, hence, abuts against a top surface of circuit board 282. Electrode 230 of dielectric filter 180 is thereby positioned in electrical connection with circuit board 282 by way of strip member 202.

Figure 9:
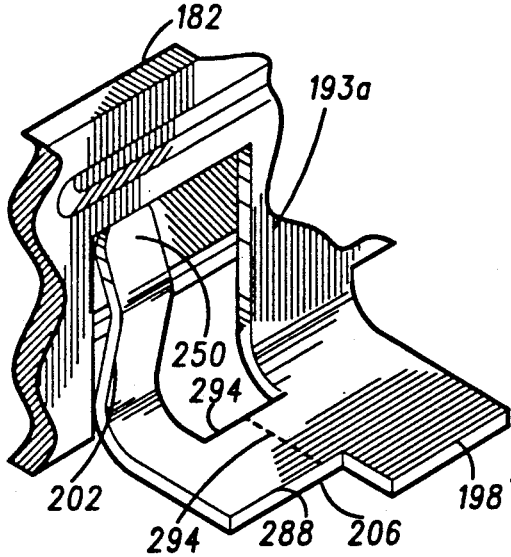
FIG. 9 is an enlarged view of a portion of the mounting bracket of a preferred embodiment of the present invention illustrating in greater detail the relationship between an electrically-conductive strip member and a foot member which form portions of the mounting bracket.

The enlarged, cutaway view of FIG. 9 illustrates in greater detail strip member 202. As noted hereinabove, a strip member 202 is formed integral with foot member 198 and is connected thereto by isthmal portion 206. Strip member 202 is "s-shaped" in configuration such that first end 250 of strip member 202 is of an elevation heightened relative to second end 288 of strip member 202. When dielectric filter 180 is positioned in supportive engagement against the support surface of mounting bracket 182, and mounting bracket 182 is affixed in position upon a substrate, such as circuit board 282 of FIG. 8, electrode 230 of the dielectric filter 180 is maintained in electrical connection with the substrate by way of strip member 202.

However, because mounting bracket 182 is maintained in electrical connection with the electrically-conductive material coated upon the surface portions of dielectric filter 180, and because strip member 202 is integrally formed with foot member 198 which is, in turn, formed integral with sidewall 193a of the mounting bracket 182, the electrode 230 becomes electrically connected to such electrically-coated material coated upon the filter. Appropriate application of a solder material to desired locations of the dielectric filter 180, mounting bracket 182, strip member 202, and circuit board 282 of FIG. 8 and heating of the dielectric filter assembly 276 together with the printed circuit board 282 (or other substrate upon which the mounting bracket 182 is mounted) according to a conventional reflow solder technique forms solder connections at the desired locations to affix, and to electrically interconnect the desired portions of dielectric filter 180 to the circuit board 282.

To electrically isolate the electrode 230 of filter 180 from such electrically-coated material once the filter is positioned in supportive engagement upon the support surface formed of the mounting bracket 182, isthmal portion 206 is cut, or otherwise severed, along a line indicated by X-markings 294.

Electrode 230 is maintained in the electrical connection with the circuit board 282 by way of strip member 202, but is electrically isolated from other surface portions of the dielectric filter 180 and mounting bracket 182.

The enlarged, cutaway view of FIG. 10a illustrates the positioning of mounting bracket 282 and hooked projection 194 during insertion of the hooked projection 194 through an aperture 284 formed to extend through circuit board 282. Aperture 284 is of dimensions such that insertion of hooked projection 194 therein is permitted, but compressive forces are exerted against back-angled portions 194a and 194b of the hooked projection 194. Elastic deformation permitted of the back-angled portions 194a and 194b *pl caused by the exertion of the compressive forces thereupon permits translation of the hooked projection 194 through aperture 284.*

FIG. 10b is an enlarged, cutaway view, similar to that of FIG. 10a but wherein mounting bracket 182 is affixed in position upon circuit board 282. Hooked projection 194 is of a length such that, when a bottom surface of mounting bracket 182 abuts against a top surface of circuit board 282, back-angled portions 194a and 194b extend at or beyond the bottom surface of circuit board 282. Compressive forces exerted against the portions 194a and 194b by sidewalls defining aperture 284 are no longer exerted. Because of the elasticity of the back-angled portions 194a and 194b, re-expansion of the portions 194a and 194b occurs, and the diametrical dimension across back-angled portions 194a and 194b exceeds that of the diameter of aperture 284. Translation of the hooked projection 194 out of aperture 284 is prevented, and mounting bracket 182 is thereby affixed in position upon circuit boards 282.

Turning now to the flow diagram of FIG. 11, the method steps of the method for mounting a dielectric filter upon a substrate of the present invention are listed. First, and as indicated by block 310, a support surface is formed upon the substrate to support the dielectric filter in supportive engagement thereat. Next, and as indicated by block 314, portions of the dielectric filter are electrically connected to a desired portion of the substrate. Next, and as indicated by block 318, the portions of the dielectric filter electrically connected to the desired portion of the substrate is electrically isolated therefrom.

As mentioned hereinabove, the support surface is formed of the mounting bracket, and, as illustrated in the preferred embodiment of FIGS. 5-8, the support surface is comprised of tabular indentations formed of portions of the sidewalls of the mounting bracket to permit seating of the dielectric filter in supportive engagement thereagainst. Strip members of electrically-conductive material formed integral with the mounting bracket, and as illustrated n the preferred embodiment of FIGS. 5-9, interconnect the portions of the dielectric filter (in the preferred embodiment, the electrodes formed thereupon), and the substrate. In the preferred embodiment, more particularly, the substrate comprises a circuit board upon which an electrical circuit is disposed.

A reflow solder technique may be advantageously utilized to form a solder connection between the strip members and the dielectric filter and between the strip members and the substrate. Because formation of the solder connections by a reflow solder technique does not result in formation of large amounts of solder flux, the need to remove such solder flux by application of a freon (tm)-based material (conventionally required when solder connections are formed by immersion of a substrate into a molten, solder bath) is obviated.

Once solder connections have been formed, the portions of the dielectric filter (i.e., in the preferred embodiment, the electrodes formed thereupon) connected to the desired portion of the substrate is electrically isolated from the support surface formed of the mounting bracket by severing, by cutting or otherwise, of the strip members from the mounting bracket.

The dielectric filter and mounting bracket of the present invention may be advantageously utilized to form a filter for a two-way radio, such as a radiotelephone. The radiotelephone may, for example, be similar tot he transceiver shown and described in Motorola instruction manual number 68P8107E40, and entitled "DYNATAC Cellular Mobile Telephone" published by Motorola C&E Parts, 1313 East Algonquin Road, Schaumburg, Ill. 60196.

FIG. 12 is a block diagram of a two-way radio similar to such radiotelephone, and is indicated, generally, by reference numeral 400. Radiotelephone 400 may, for example, comprise a radiotelephone utilized in a cellular, communication system. A signal transmitted upon a radio frequency channel is received by antenna 406, which, subsequent to reception, is supplied to filter 412 on line 418. Filter 412 filters the received signal and generates a filtered signal on line 418. Filter 412 may be formed of a dielectric filter and mounted upon a circuit board by a mounting bracket as described with respect to FIGS. 3-11 hereinabove.

Line 418 is coupled to mixer 424 which also receives an oscillating signal on line 430 formed by frequency synthesize 438 responsive to the oscillating frequency of reference oscillator 446, the oscillating signal generated thereat being connected to synthesizer 438 on line 452. Mixer 424 converts downward in frequency the signal supplied thereto on line 418, and generates a down-converted signal on line 458 which is supplied to filter 464. Filter 464 generates a filtered signal on line 472 which is supplied to second mixer 680. Filter 464 may also be formed of a dielectric filter and mounted upon a circuit board by a mounting bracket as described with respect to FIGS. 3-11 hereinabove.

Mixer 480 additionally receives an oscillating input on line 686 supplied by oscillator 492. The oscillating frequency of oscillator 492 is controlled by the oscillating frequency of reference oscillator 446 and is coupled to oscillator 446 on line 498. Mixer 480 generates a second, down-converted signal on line 504 which is supplied to the demodulator circuit 510. The demodulator circuit 510 generates a demodulated signal on line 512 which is supplied to a transducer, such as speaker 524. Speaker 524 converts the signal supplied thereto into an audible signal.

A transmit portion of radiotelephone 400 includes a transducer such as microphone 530 which converts a voice signal into electrical form and generates a signal indicative thereof on line 536. Line 536 is coupled to modulator 542 which converts the electrical signal supplied thereto into a modulated form. While not shown, modulator 542 includes mixing circuitry, preferably coupled to reference oscillator 446, for generating a modulated signal on line 560. Line 560 is coupled to filter 570, which also may be formed of a dielectric filter and mounted upon a circuit board by a mounting bracket as described with respect to FIGS. 3–11 hereinabove. Filters 412 and 570 may together form a duplex filter with appropriate number of, and positioning of, electrically-conductive strip members. A filtered signal generated by filter 570 is coupled to antenna 406 by line 580. The block diagram of FIG. 12 illustrates but one circuit of which the dielectric filter and mounting bracket of the present invention may form a portion. The dielectric filter and mounting bracket of the preferred embodiment of FIGS. 3–10 may, of course, be advantageously utilized to form portions of other electrical circuits.

While the present invention has been described in connection with the preferred embodiments shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. A mounting bracket for mounting a dielectric filter construction upon a substrate, said mounting bracket comprising:
    support means forming a support surface for supporting the dielectric filter construction in supportive engagement thereat; and
    connecting means formed integral with the support surface for electrically connecting portions of the dielectric filter construction to the substrate when the dielectric filter construction is supportively engaged at the support surface, said connecting means being severable from said support surface once the dielectric filter construction is supportively engaged thereat to isolate electrically the connecting means and the support surface thereby while maintaining electrical connection between the portions of the dielectric filter construction and the substrate.

2. The mounting bracket of claim 1 further comprising means for affixing the support surface in position upon the substrate.

3. The mounting bracket of claim 2 wherein said means for affixing comprises at least one hooked projection formed integral with the support surface to extend downwardly therefrom for insertion through at least one corresponding aperture formed to extend through the substrate.

4. The mounting bracket of claim 3 wherein the hooked projection is of a length such that an end portion of the hooked projection protrudes beneath a bottom surface of the substrate when the support surface is positioned in abutting engagement upon the substrate.

5. The mounting bracket of claim 4 wherein said hooked projection comprises at least one angled portion formed at said end portion of the hooked projection, said angled portion being capable of elastic compression during insertion through the aperture formed to extend through the substrate and re-expansion when the support surface is positioned in the abutting engagement upon the substrate.

6. The mounting bracket of claim 5 wherein said hooked projection comprises first and second back-angled portions disposed at end portions of the hooked projection wherein insertion of the first and second back-angled portions through the aperture formed through the substrate causes elastic compression and re-expansion of the first and second back-angled portions of the hooked projection to affix the support surface in position upon the substrate.

7. The mounting bracket of claim 1 wherein said support surface is formed of portions of sidewalls formed about, and extending upwardly from, a baseplate formed of an electrically-conductive material.

8. The mounting bracket of claim 7 wherein said sidewalls extend about a perimeter of the dielectric filter construction when the dielectric filter construction is supportively engaged at the support surface wherein said sidewalls abut against sides of the dielectric filter construction which define the perimeter of the dielectric filter construction.

9. The mounting bracket of claim 8 wherein said portions of the sidewalls forming the support surface comprise tabular indentations formed upon at least one of the sidewalls.

10. The mounting bracket of claim 9 wherein said support surface is comprised of at least three tabular indentations formed at similar heights above the baseplate.

11. The mounting bracket of claim 9 further comprising at least one horizontally-extending foot member formed integral with the sidewalls and having a bottom surface positioned in a manner co-planar with a bottom surface of the baseplate such that the bottom surface of the at least one foot member abuts against the substrate when the baseplate rests thereagainst.

12. The mounting bracket of claim 11 wherein said connecting means for electrically connecting is comprised of at least one strip member formed of an electrically-conductive material, each strip member of said at least one strip member having a first and a second end wherein the first end thereof is positioned to abut against a bottom surface of the dielectric filter construction when the dielectric filter construction is supportively engaged at the support surface, and the second end thereof is positioned to abut against the substrate.

13. The mounting bracket of claim 12 further comprising an isthmal member formed integral with at least one strip member and with at least one foot member of the at least one strip member and the at least one foot member, respectively, for interconnecting the at least one strip member and the at least one foot member.

14. The mounting bracket of claim 13 wherein said isthmal member is of reduced diametrical dimensions relative to the foot member.

15. The mounting bracket of claim 8 further comprising at least one spring element formed upon at least one of the sidewalls for exerting a spring force to maintain the dielectric filter construction in abutting engagement with the sidewalls.

16. A dielectric filter assembly mountable upon a substrate, said dielectric filter assembly comprising:
   a dielectric filter comprised of a dielectric material having at least one resonator formed of a cavity formed to extend between at least two filter surfaces defining the dielectric filter, wherein filter surface portions, including portions of said at least two filter surfaces, are coated with an electrically-conductive material; and
   a mounting bracket for receiving said dielectric filter, said mounting bracket having support means forming a support surface for supporting the dielectric filter construction in supportive engagement thereat, and connecting means formed integral with the support surface for electrically connecting portions of the dielectric filter to the substrate when the dielectric filter is supportively engaged at the support surface, said connecting means for electrically connecting being severable from said support surface once the dielectric filter construction is supportively engaged thereat to isolate electrically the connecting means and the support surface thereby while maintaining electrical connection between portions of the dielectric filter and the substrate.

17. The dielectric filter assembly of claim 16 further comprising means for affixing the support surface in position upon the substrate.

18. The dielectric filter assembly of claim 17 wherein said means for affixing comprises at least one hooked projection formed integral with the support surface to extend downwardly therefrom for insertion through at least one corresponding aperture formed to extend through the substrate.

19. The dielectric filter assembly of claim 18 wherein the hooked projection is of a length such that an end portion of the hooked projection protrudes beneath a bottom surface of the substrate when the support surface is positioned in abutting engagement upon the substrate.

20. The dielectric filter assembly of claim 19 wherein said hooked projection comprises at least one angled portion formed at said end portion of the hooked projection, said angled portion being capable of elastic compression during insertion through the aperture formed to extend through the substrate and re-expansion when the support surface is positioned in the abutting engagement upon the substrate.

21. The dielectric filter assembly of claim 20 wherein said hooked projection comprises first and second back-angled portions disposed at end portions of the hooked projection wherein insertion of the first and second back-angled portions through the aperture formed through the substrate causes elastic compression and re-expansion of the first and second back-angled portions of the hooked projection to affix the support surface in position upon the substrate.

22. The dielectric filter assembly of claim 16 wherein said support surface is formed of portions of sidewalls formed about, and extending upwardly from, a baseplate formed of an electrically-conductive material.

23. The dielectric filter assembly of claim 22 wherein said sidewalls extend about a perimeter of the dielectric filter construction when the dielectric filter construction is supportively engaged at the support surface wherein said sidewalls abut against sides of the dielectric filter construction which define the perimeter of the dielectric filter construction.

24. The dielectric filter assembly of claim 23 wherein said portions of the sidewalls forming the support surface comprise tabular indentations formed upon at least one of the sidewalls.

25. The dielectric filter assembly of claim 24 wherein said support surface is comprised of at least three tabular indentations formed at similar heights above the baseplate.

26. The dielectric filter assembly of claim 25 further comprising at least one horizontally-extending foot member formed integral with the sidewalls and having a bottom surface positioned in a manner co-planar with a bottom surface of the baseplate such that the bottom surface of the at least one foot member abuts against the substrate when the baseplate rests thereagainst.

27. The dielectric filter assembly of claim 26 wherein said connecting means is comprised of at least one strip member comprised of an electrically-conductive material, each strip member of said at least one strip member having a first and a second end wherein the first end thereof is positioned to abut against a bottom surface of the dielectric filter construction when the dielectric filter construction is supportively engaged at the support surface, and the second end thereof is positioned to abut against the substrate.

28. The dielectric filter assembly of claim 27 further comprising a an isthmal member formed integral with at least one strip member and with at least one foot member of the at least one strip member and the at least one foot member, respectively, for interconnecting the at least one strip member and the at least one foot member.

29. The dielectric filter assembly of claim 28 wherein said isthmal member is of reduced diametrical dimensions relative to the foot member.

30. The dielectric filter assembly of claim 23 further comprising at least one spring element formed upon at least one of the sidewalls for exerting a spring force to maintain the dielectric filter construction in abutting engagement with the sidewalls.

31. A method for mounting a dielectric filter upon a substrate, the substrate having at least one aperture formed to extend therethrough, said method comprising the steps of:
   forming a support surface upon the substrate to support the dielectric filter in supportive engagement thereat, the support surface having at least one hooked projection and at least one strip member comprised of an electrically conductive material and formed integral therewith, the at least one strip member having a first and a second end whereby the second end of the at least one strip member is positioned to abut against the substrate;
   affixing the support surface in position upon the substrate by inserting the at least one hooked projection formed integral with the support surface through a corresponding aperture of the at least one aperture formed to extend through the substrate;

mounting the dielectric filter upon the support surface such that a bottom surface of the dielectric filter abuts against the first end of the at least one strip member formed integral with the support surface to electrically connect portions of the dielectric filter to a desired portion of the substrate thereby; and electrically isolating said portions of the dielectric filter electrically connected to the desired portion of the substrate from the support surface formed upon the substrate during said step of forming.

32. A dielectric filter assembly forming a filter circuit mountable upon a circuit board having an electrical circuit disposed thereupon, said dielectric filter assembly comprising:

a dielectric filter comprised of a dielectric material having at least one resonator formed of a cavity formed to extend between at least two filter surfaces of the dielectric filter, wherein filter surface portions, including portions of said at least two filter surfaces, are coated with an electrically-conductive material, said dielectric filter further having an input electrode and an output electrode formed upon a filter surface thereof;

a mounting bracket for receiving said dielectric filter, said mounting bracket having means forming a support surface for receiving the filter surface having the input electrode and the output electrode formed thereupon of the dielectric filter in abutting engagement thereagainst for supportive engagement thereat; and a first electrically-conductive strip member formed integral with the support surface of electrically-connecting the input electrode formed upon the filter surface of the dielectric filter to a desired portion of the circuit board when the dielectric filter is positioned in said supportive engagement at the mounting bracket, said first electrically-conductive strip member being severable from the support surface once the dielectric filter is positioned in the supportive engagement at the support surface to isolate electrically the first electrically-conductive strip member and the support surface; and a second electrically-conductive strip member formed integral with the support surface for electrically-connecting the output electrode formed upon the filter surface of the dielectric filter to a desired portion of the circuit board when the dielectric filter is positioned in said supportive engagement at the mounting bracket, said second electrically-conductive strip member being severable from the support surface once the dielectric filter is positioned in the supportive engagement at the support surface to isolate electrically the second electrically-conductive strip member and the support surface.

33. The dielectric filter assembly of claim 32 further comprising at least one hooked projection formed integral with the support surface to extend downwardly therefrom for insertion through at least one corresponding aperture formed to extend through the substrate.

* * * * *